(12) United States Patent
Gafvert

(10) Patent No.: US 7,960,977 B2
(45) Date of Patent: Jun. 14, 2011

(54) DETERMINING DEGRADED INSULATING ABILITY IN INSULATION PROVIDED BETWEEN TWO OBJECTS OF AN INDUCTIVELY OPERATING ELEMENT

(75) Inventor: Uno Gafvert, Vasteras (SE)

(73) Assignee: ABB Research Ltd. (CH)

( * ) Notice: Subject to any disclaimer, the term of this patent is extended or adjusted under 35 U.S.C. 154(b) by 0 days.

(21) Appl. No.: 12/904,864

(22) Filed: Oct. 14, 2010

(65) Prior Publication Data

US 2011/0025298 A1 Feb. 3, 2011

Related U.S. Application Data

(63) Continuation of application No. PCT/EP2009/054053, filed on Apr. 3, 2009.

(30) Foreign Application Priority Data

Apr. 14, 2008 (EP) .................................. 08103524

(51) Int. Cl.
*G01R 31/06* (2006.01)
*G01R 31/12* (2006.01)
*H01H 31/12* (2006.01)

(52) U.S. Cl. .................. 324/547; 324/551; 324/536

(58) Field of Classification Search .................. 324/547, 324/551, 536

See application file for complete search history.

(56) References Cited

U.S. PATENT DOCUMENTS

| | | | |
|---|---|---|---|
| 3,514,696 A | | 5/1970 | Clinton |
| 5,506,511 A | * | 4/1996 | Nilsson et al. ............... 324/553 |
| 6,192,317 B1 | * | 2/2001 | Yazici et al. .................. 702/58 |
| 6,870,374 B2 | | 3/2005 | Perkins et al. |
| 7,285,961 B2 | | 10/2007 | Shinmoto et al. |

FOREIGN PATENT DOCUMENTS

| | | |
|---|---|---|
| DE | 10226615 A1 | 1/2004 |
| EP | 0520193 A1 | 12/1992 |

OTHER PUBLICATIONS

"Dielectric Frequency Response Measurement as a Tool for Troubleshooting Insulation Power Factor Problems", Mark Perkins, Asim Fazlagic, George Frimpong, Conference Record of the 2002 IEEE International Symposium on Electrical Insulation, Boston, MA USA; 4 pages.

(Continued)

*Primary Examiner* — Amy He
(74) *Attorney, Agent, or Firm* — St. Onge Steward Johnston & Reens LLC

(57) ABSTRACT

A method, device and computer program product for determining the change in insulating ability of the insulation provided between two objects of an inductively operating element, where at least one of the objects is a winding. The device includes an analyzing unit, which obtains a first frequency spectrum associated with a frequency response to a signal of varying frequency, where the signal of varying frequency can be applied to a first object of the inductively operating element and the frequency response is obtainable from a second object of the inductively operating element, compares the obtained first frequency spectrum with a second reference frequency spectrum, detects a peak in the obtained first frequency spectrum that does not appear in the second reference frequency spectrum, analyzes the shape of the detected peak, and determines the change in insulating ability based on the analyzed shape.

18 Claims, 4 Drawing Sheets

OTHER PUBLICATIONS

"Dielectric Response Analysis of Real Insulation Systems", Uno Gafvert, 2004 International Conference on Solid Dielectrics, Toulouse, France, Jul. 5-9, 2004; 12 pages.

U. Gäfvert, L. Adeen, M. Tapper, P. Ghasemi and B. Jösson: "Dielectric Spectroscopy in Time and Frequency Domain Applied to Diagnostics of Power Transmissions", 2000 IEEE 6th International Conference on Properties and Applications of Dielectric Materials (ICPADM), Xian, China, Jun. 21-26, 2000 (abstract only).

European Search Report; Application No. EP 08 10 3524; Sep. 24, 2008; 8 pages.

"Evaluation of Transformer Insulation by Frequency Domain Technique" P.K. Poovamma, A. Sudhindra, K. Mallikarjunappa, T.R. Afzal Ahamad, 2007 International Conference on Solid Dielectrics, Winchester, UK, Jul. 8-13, 2007; abstract only.

"Frequency response of oil impregnated pressboard and paper samples for estimating moisture in transformer insulation", Chandima Ekanayake, Stanislaw M. Gubanski, Andrzej Graczkowski, Krzysztof Walczak, IEEE Transactions on Power Delivery, vol. 21, No. 3, Jul. 2006; abstract only.

International Preliminary Report on Patentability and Written Opinion of the International Searching Authority; PCT/EP2009/054053; Oct. 19, 2010; 7 pages.

International Search Report; PCT/EP2009/054053; Jun. 23, 2009; 3 pages.

\* cited by examiner

US 7,960,977 B2

DETERMINING DEGRADED INSULATING ABILITY IN INSULATION PROVIDED BETWEEN TWO OBJECTS OF AN INDUCTIVELY OPERATING ELEMENT

CROSS-REFERENCE TO RELATED APPLICATIONS

The present application is a continuation of pending International patent application PCT/EP2009/054053 filed on Apr. 3, 2009 which designates the United States and claims priority from European patent application 08103524.8 filed on Apr. 14, 2008, the content of which is incorporated herein by reference.

FIELD OF THE INVENTION

The present invention relates to a method, device and computer program product for determining the change in insulating ability of the insulation provided between two objects of an inductively operating element, where at least one of the objects is a winding.

BACKGROUND OF THE INVENTION

The insulation between objects in inductively operating elements, for instance the insulation provided between two windings of a transformer, may degrade with time. One reason may be because this insulation, which in many high-voltage applications is made of paper or pressboard, is contaminated with a contaminant, for instance in the form of Copper Sulphide ($Cu_2S$). In order to be able to provide suitable countermeasures, it is then of interest to determine the extent of degradation of the insulating ability. This may be done in order to know when the transformer is to be replaced and/or serviced. A better knowledge of the insulating ability can be of high economic importance. Through such knowledge it is furthermore easier to determine when a transformer is to be disconnected, which may also be of advantage from a safety point of view.

It is advantageous if this may be done without having to disassemble the transformer and directly inspect the insulating material. This is both cumbersome and time consuming. The transformer can not be used during such investigation. There is furthermore a risk that the transformer will be destroyed by the disassembly.

One type of such an inspection method that is frequently used nowadays is the dielectric frequency response method. With regard to this method some research has been carried out.

A lot of the literature in this area is directed towards a general description of the method, but without giving any real hints about how it should be applied practically.

Some examples are given below:

"Frequency response of oil impregnated pressboard and paper samples for estimating moisture in transformer insulation", Chandima Ekanayake, Stanislaw M. Gubanski, Andrzej Graczkowski, Krzysztof Walczak, IEEE Transactions on Power Delivery, vol. 21, no. 3, July 2006, describes the frequency domain spectra of oil impregnated pressboard and paper samples, which can be used in modeling of results of diagnostic measurements in power transformers.

"Evaluation of Transformer Insulation by Frequency Domain Technique" P. K. Poovamma, A. Sudhindra, K. Mallikarjunappa, T. R. Afzal Ahamad, 2007 International Conference on Solid Dielectrics, Winchester, UK, Jul. 8-13, 2007, discusses measurements of dielectric response being used for assessing the paper-oil insulating system in transformers.

"Dielectric Response Analysis of Real Insulation Systems", Uno Gafvert, 2004 International Conference on Solid Dielectrics, Toulouse, France, Jul. 5-9, 2004 discusses application of dielectric frequency response methods to a number of practically important real insulation system.

U.S. Pat. No. 7,292,048 describes a method and device for measuring a dielectric response of an electrical insulating system, where a first measurement result is determined by a frequency domain method and a second measurement result is determined by a time domain method. The first measurement result and the second measurement result are combined to form an overall measurement result as the dielectric response. The document is unfortunately silent regarding how the frequency domain method is actually used.

However, there exists one document, which does describe a practical solution to the problem of determining the degraded insulating ability of an insulation provided between two windings in a transformer. This document is U.S. Pat. No. 6,870,374.

U.S. Pat. No. 6,870,374 describes a method for identifying a type of abnormality in an insulation system of a power transformer, where dielectric losses in a section of the insulation system are measured, theoretical dielectric losses for the section are calculated based on the material properties, geometry, and temperature of the section, and a graphical representation of a percent difference between the measured and calculated dielectric losses is generated. A dielectric response signature is prepared from the DFR test on a transformer. The signature and measured response is compared with a modeled response of a transformer with a "normal" insulating structure and a library of signatures of known defects. Based on the comparison power factor defects in the insulation structure of the transformer under test can then be diagnosed.

The above mentioned method is also described in "Dielectric Frequency Response Measurement as a Tool for Troubleshooting Insulation Power Factor Problems", Mark Perkins, Asim Fazlagic, George Frimpong, Conference Record of the 2002 IEEE International Symposium on Electrical Insulation, Boston, Mass. USA.

In view of what has been described above there is therefore a need for providing a different way to determine the change in insulating ability, which considers also the cause of the changes.

SUMMARY OF THE INVENTION

The present invention is directed towards providing a solution to the problem of determining the change in insulating ability of the insulation provided between two objects of an inductively operating element, where at least one of the objects is a winding.

This problem is generally solved through obtaining a first frequency spectrum associated with a frequency response to a signal of varying frequency, where said signal of varying frequency is a signal that can be applied to a first object of the inductively operating element and the frequency response is obtainable from a second object of the inductively operating element, comparing the obtained first frequency spectrum with a second reference frequency spectrum, detecting a peak in the obtained first frequency spectrum that does not appear in the second reference frequency spectrum, analyzing the shape of the detected peak and determining the change in insulating ability based on the analyzed shape of the detected peak.

One object of the present invention is to provide a method for determining the change in insulating ability of the insulation provided between two objects of an inductively operating element, where at least one of the objects is a winding, which method can be performed without having to disassemble the inductively operating element.

This object is according to a first aspect of the present invention solved through a method for determining the change in insulating ability of the insulation provided between two objects of an inductively operating element, where at least one of the objects is a winding, and comprising the steps of:

obtaining a first frequency spectrum associated with a frequency response to a signal of varying frequency, where said signal of varying frequency is a signal that can be applied to a first object of the inductively operating element and the frequency response is obtainable from a second object of the inductively operating element, comparing the obtained first frequency spectrum with a second reference frequency spectrum, detecting a peak in the obtained first frequency spectrum that does not appear in the second reference frequency spectrum, analyzing the shape of the detected peak, and determining the change in insulating ability based on the analyzed shape of the detected peak.

Another object of the present invention is to provide a device for determining the change in insulating ability of the insulation provided between two objects of a inductively operating element, where at least one of the objects is a winding, which can performed this determination without having to disassemble the inductively operating element.

This object is according to a second aspect of the present invention solved through a device for determining the change in insulating ability of the insulation provided between two objects of an inductively operating element, where at least one of the objects is a winding, and comprising an analyzing unit arranged to obtain a first frequency spectrum associated with a frequency response to a signal of varying frequency, where said signal of varying frequency is a signal that can be applied to a first object of the inductively operating element and the frequency response is obtainable from a second object of the inductively operating element, compare the obtained first frequency spectrum with a second reference frequency spectrum, detect a peak in the obtained first frequency spectrum that does not appear in the second reference frequency spectrum, analyze the shape of the detected peak, and determine the change in insulating ability based on the analyzed shape of the detected peak.

Another object of the present invention is to provide a computer program product for determining the change in insulating ability of the insulation provided between two objects of an inductively operating element, where at least one of the objects is a winding, which allows this determination to be performed without having to disassemble the inductively operating element.

This object is according to a third aspect of the present invention solved through a computer program product for determining the change in insulating ability of the insulation provided between two objects of an inductively operating element, where at least one of the objects is a winding, and comprising computer program code provided on a computer readable medium and being configured to make a computer perform, when said code is loaded into said computer obtain a first frequency spectrum associated with a frequency response to a signal of varying frequency, where said signal of varying frequency is a signal that can be applied to a first object of the inductively operating element and the frequency response is obtainable from a second object of the inductively operating element, compare the obtained first frequency spectrum with a second reference frequency spectrum, detect a peak in the obtained first frequency spectrum that does not appear in the second reference frequency spectrum, analyze the shape of the detected peak, and determine the change in insulating ability based on the shape of the detected peak.

According to one variation of the present invention an amount of degraded insulating ability is determined based on the frequency of the peak value of the peak.

According to another variation of the present invention a volume of the insulation having a degraded insulating ability is determined based on the height of the peak above the reference frequency spectrum.

The present invention has a number of advantages. It determines the degradation of the insulating ability of the insulation without disassembling or in other ways negatively influencing the inductively operating element. Through such a determination it is then easier to determine a service activity to be performed on the element, such as when it is to be replaced, repaired and/or serviced. A better knowledge of the insulating ability can therefore be of high economic importance. Through such knowledge it is furthermore easier to determine when an inductively operating element is to be disconnected, which may also be of advantage from a safety point of view.

BRIEF DESCRIPTION OF THE DRAWINGS

The present invention will in the following be described with reference being made to the accompanying drawings, where FIG. 1 schematically shows the device according to the present invention being connected to a primary winding of a transformer, FIG. 2 schematically shows a sectional view through one half of an exemplifying transformer, FIG. 3 schematically shows a view from above of the whole transformer in FIG. 2, FIG. 4 schematically shows the insulation between the primary and secondary winding, where a section made up of a volume V has a degraded insulating ability, FIG. 5 schematically shows an equivalent electrical circuit corresponding to the insulation with degraded insulating ability provided between the primary and secondary windings of FIG. 4.

DETAILED DESCRIPTION OF THE INVENTION

In the following, a detailed description of preferred embodiments of a device and a method according to the present invention will be given.

Figure 1:
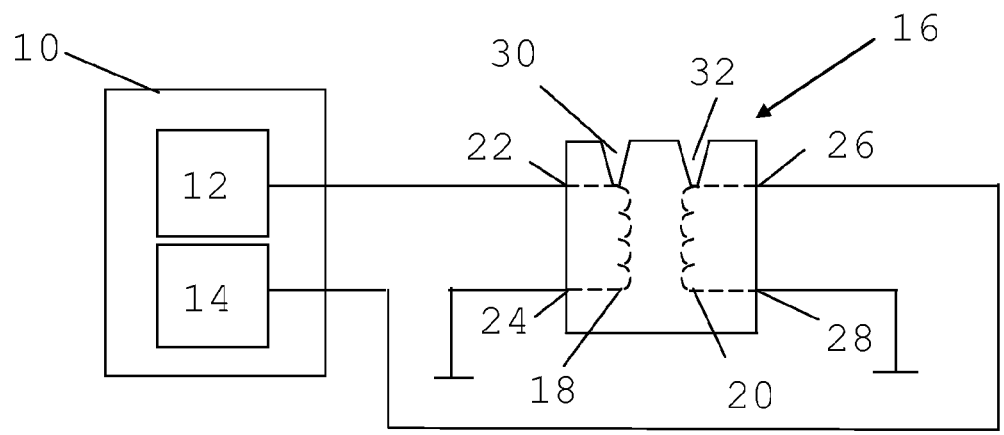

In FIG. 1 there is shown a device 10 for determining the change in insulating ability of the insulation provided between two objects of an inductively operating element 16. The device 10 of the present invention includes a signal generating unit 12 and an analyzing unit 14. The signal generating unit 12 is here arranged to be connected to a first object of the transformer, which is here a primary winding 18, and the analyzing unit 14 is arranged to be connected to a second object of the transformer, which is here a secondary winding 20.

In FIG. 1 the device 10 is connected to an inductively operating element that is here in the form of a transformer 16. The transformer 16 in FIG. 1 is schematically shown as including a first object in the form of a primary winding 18 and a second object in the form of a secondary winding 20. The transformer 16 does furthermore have a number of terminals, a first and second feeding terminal 22 and 24 for connection to the primary winding 18 and a third and fourth feeding terminal 26 and 28 for connection to the secondary winding 20. The transformer 16 shown in FIG. 1 does furthermore include a fifth and sixth terminal 30 and 32, where the fifth terminal 30 is arranged through a bushing tap that provides connectivity to the primary winding 18 and the sixth terminal 32 is arranged through a bushing tap that provides connectivity to the secondary winding 18.

In the example given here the signal generating unit 12 is connected to the first feeding terminal 22 and the analyzing unit 14 is connected to the third feeding terminal 26, while the second and fourth terminals 24 and 28 are connected to ground, although this is no strict requirement. It should be realized that this is just one way in which the device 10 may be connected to the transformer 16 and that several other ways exist, which will be described in more detail later on.

Figure 2:
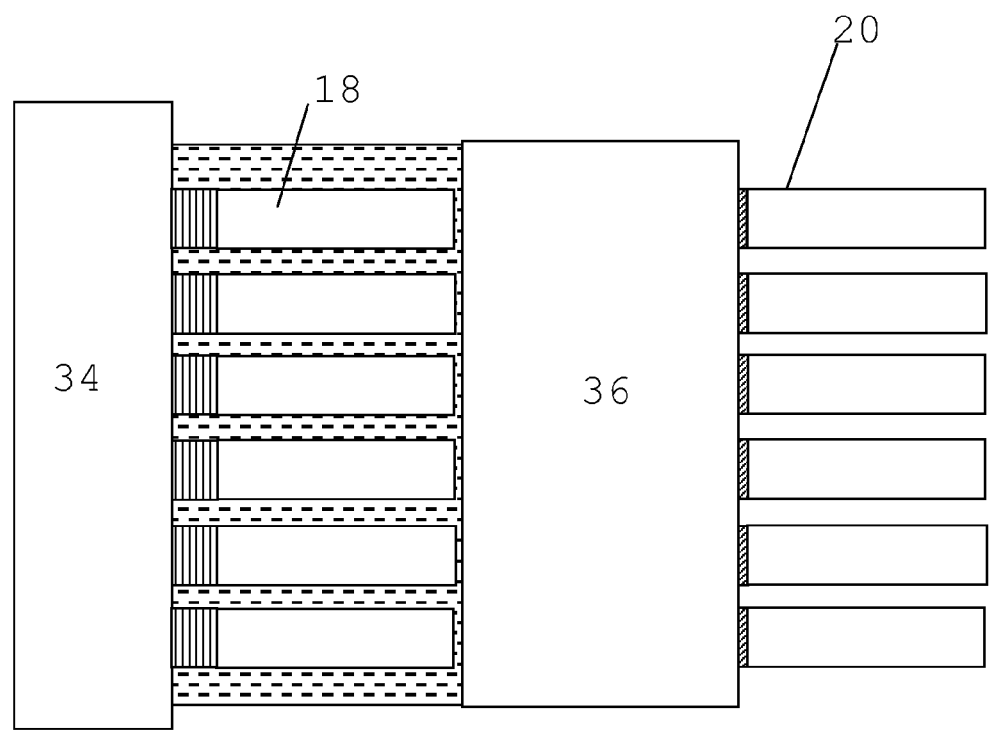
Figure 3:
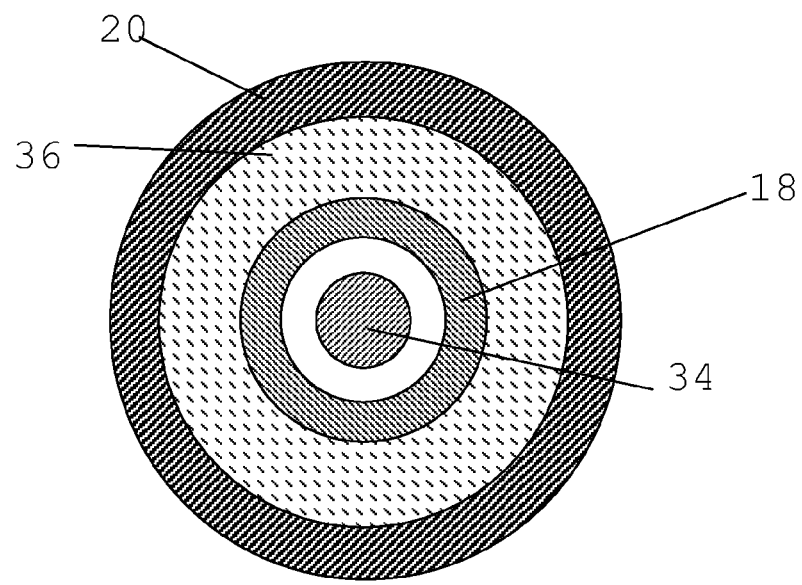

FIG. 2 shows a sectional view of half a transformer and FIG. 3 shows a view as seen from above of a whole transformer on which measurements according to the present invention may be made. As can be seen from FIGS. 2 and 3, the exemplifying transformer is provided with a primary winding 18 comprising a number of turns of wound conductor circumferentially provided around a transformer core 34. Radially spaced from this primary winding 18 there is provided a secondary winding 20 made up of a number of turns of wound conductor circumferentially provided around the primary winding 18 and the core 34. Finally there is insulation 36 provided between the two windings 18 and 20. It should here be realized that the present invention is in no way limited to this type of cylindrically shaped transformer or the use of transformer cores.

The transformer is with advantage a power transformer, i.e. a transformer that may operate at high voltages, typically in the kV range. With such large transformers the insulation 38 between the windings 18 and 20 is in many cases made of paper or pressboard, which may be soaked in oil. This insulation can electrically be seen as one or more capacitances provided in parallel with each other between the primary and secondary windings.

Now, as such a transformer is being used for a long time, it will be degraded. One type of degradation that may typically occur is that the insulation between the windings will receive impurities, such as Copper Sulphide ($Cu_2S$). Such impurities will degrade the insulating ability of the insulation, i.e. the insulation will in some sense conduct current. This degradation may furthermore be local in that only a certain volume of the insulation will be negatively influenced. Such a situation is shown in FIG. 4.

Figure 4:
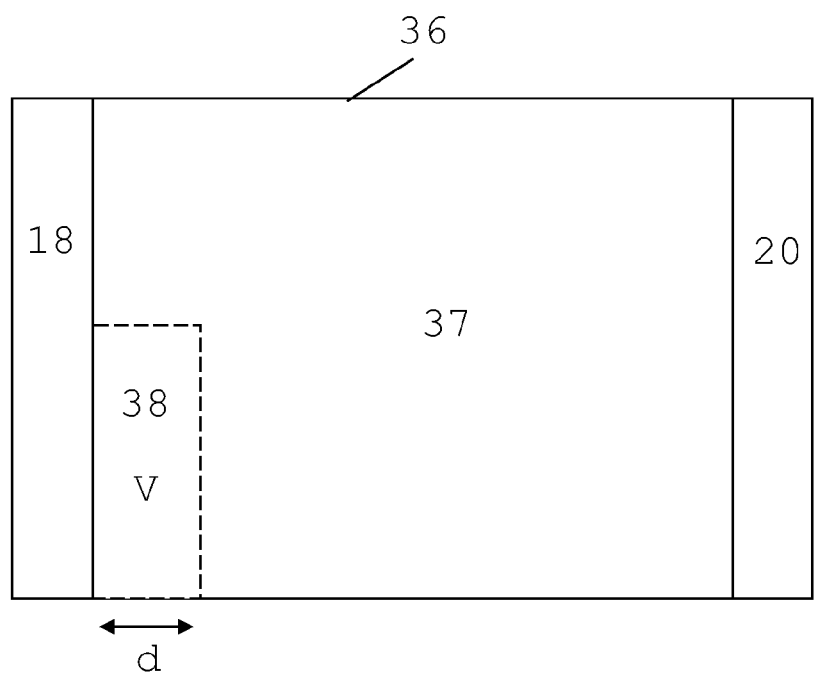

FIG. 4 schematically shows the insulation 36 between the primary and secondary windings 18 and 20. The insulation 36 is here made up of a main section 37 with normal insulating ability and a subsection 38 with degraded insulating ability. This subsection 38 here occupies a volume V. The subsection 38, which is shown as a dashed box, does furthermore have a depth d, i.e. an extension in the direction from the primary 18 to the secondary winding 20. As is indicated above, it is possible to regard the insulation as one or more capacitances connected between the primary and secondary windings 18 and 20. This model of the insulation may then be modified based on a part of the insulation, i.e. the subsection 38 with the volume V having a degraded insulating ability.

Figure 5:
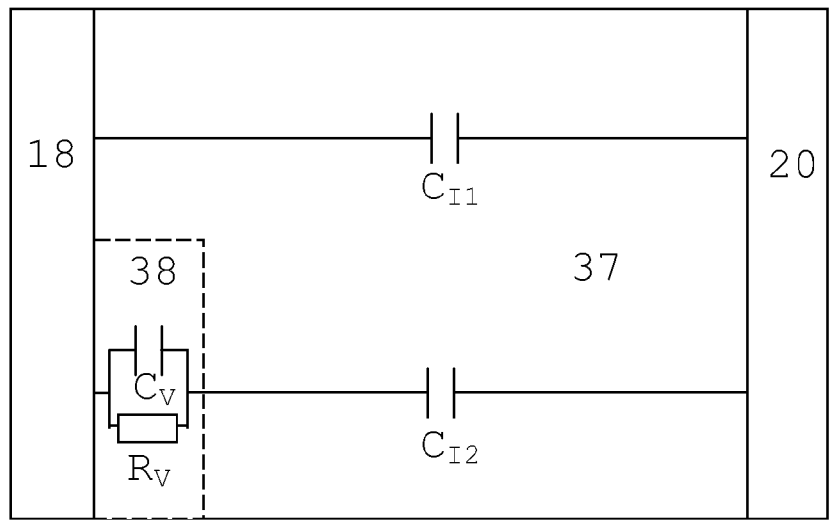

FIG. 5 shows one such modified model for the subsection 38 of FIG. 4, in which a number of electrical elements are connected between the primary and secondary windings 18 and 20. In order to show their relationship to the various sections of the insulating material, they are shown as being provided in the main section 37 of the insulation where there is no degradation as well as in the subsection 38, where there is a degradation. There are here two exemplifying branches, a first branch only provided in the main section 37, and therefore only including a capacitance $C_{f1}$ being connected between the primary and secondary windings 18 and 20. There is also a second branch also stretching between the primary and secondary windings 18 and 20. However the second branch is provided in the subsection 38 as well as in the main section 37. The part of the second branch provided in the subsection 38 here has a capacitance $C_V$ in parallel with a resistance $R_V$. This parallel circuit is in turn connected in series with a capacitance $C_{f2}$ provided in the main section 37. The branch is thus here made up of this parallel circuit in series with the capacitance $C_{f2}$.

Because of the resistance $R_V$ there is a degradation in the insulating ability of the insulation. The subsection 38 is here shown as being provided close to the primary winding 18. It should however be realized that it may be placed anywhere in the insulation 36 based on where a degradation of insulating ability may occur. The subsection 38 can furthermore stretch the whole length from the primary to the secondary winding or also stretch the whole length in a direction parallel with the primary and secondary windings. In these cases the model of FIG. 5 would of course be modified accordingly. Generally speaking though, the subsection 38 will be made up of a parallel circuit made up of a resistance and a capacitance and being connected in series and/or in parallel with one or more capacitances of the main section depending on the extension of this volume between the windings or in parallel with the length of the windings.

According to the present invention it is possible to determine the volume V of the subsection 38 as well as the depth d. It is also possible to determine the amount of degraded insulating ability, which is dependent on the resistance $R_V$.

Because of such a determination it is then easier to determine when service, repair or replacement is to be made.

Figure 6:
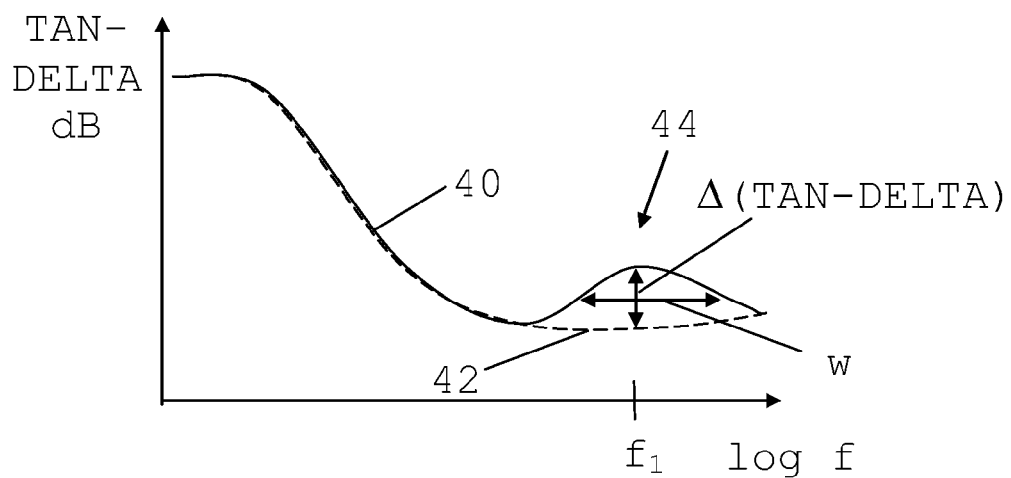
FIG. 6 shows an exemplifying first frequency spectrum of a frequency response to a signal of varying frequency that has been sent into the primary winding of the transformer together with a corresponding second reference frequency spectrum, and FIG. 7 schematically shows a number of method steps being taken in a method according to the present invention.
Figure 7:
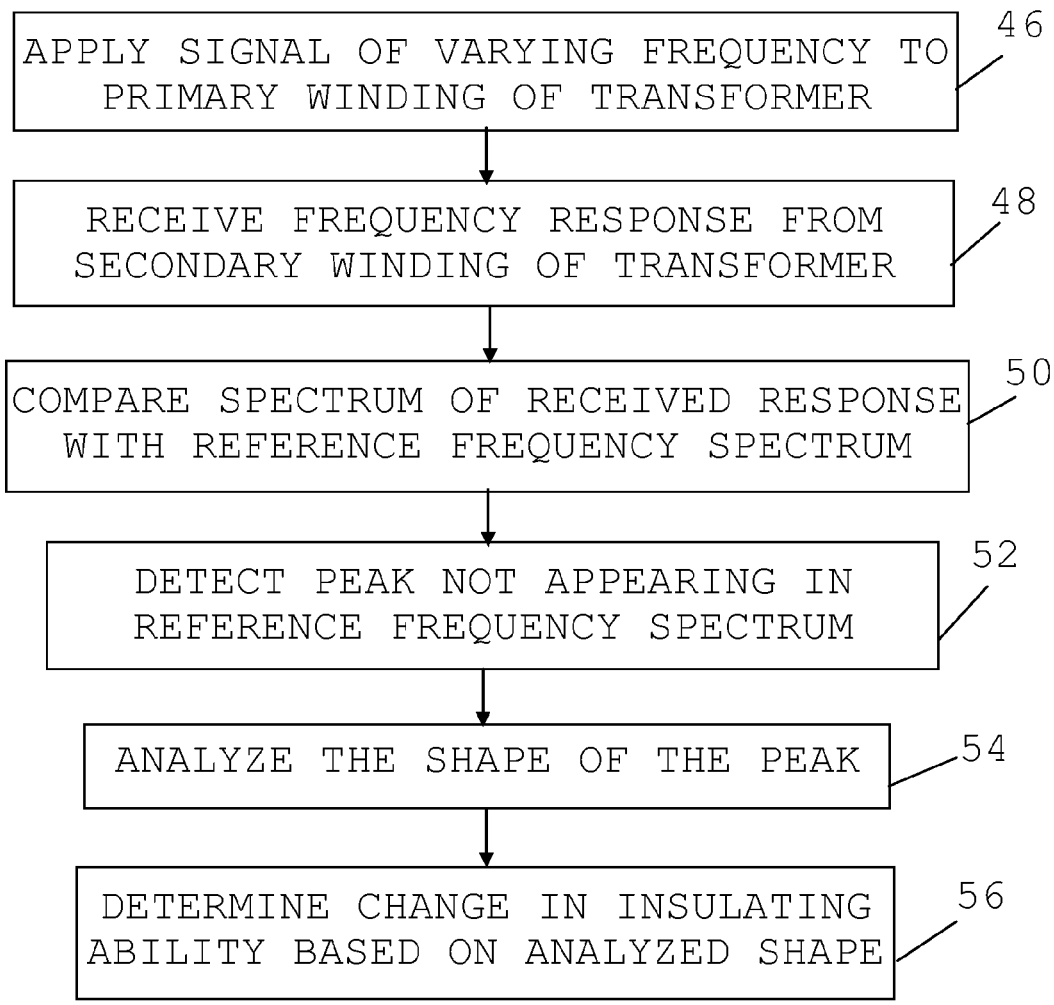

The functioning of the present invention will now be described in more detail with reference also being made to FIGS. 6 and 7, where FIG. 6 shows an exemplifying first frequency spectrum of a frequency response to a signal of varying frequency that has been sent into the primary winding of the transformer together with an exemplifying second reference frequency spectrum that corresponds to the first frequency spectrum, and FIG. 7 schematically shows a number of method steps being taken in a method according to the present invention.

The first frequency spectrum 40 is in FIG. 6 shown with a solid line, while the second reference frequency spectrum 42 is shown with a dashed line. These are furthermore shown as curves 40 and 42 provided in a diagram having an X- and a Y-axis, where the Y-axis show the first frequency spectrum and reference spectrum as Tan-Delta in dB and the X-axis shows the frequency in logarithmic form, i.e. as log f. Tan-Delta is a well-known way to represent the frequency spectrum of insulations, and will as such not be described in any more detail here. The exemplifying first frequency spectrum curve 40 furthermore has a peak 44, which cannot be found in the second reference frequency spectrum 42. This peak 44 has a peak value provided at a frequency $f_1$. At this frequency $f_1$ the peak 44 is also provided a height $\Delta$(Tan-Delta) above the second reference frequency spectrum 42. The peak 44 furthermore has a width w. The second reference frequency spectrum may be calculated based on the properties of the insulation, and may consider such things as elements of the insulation such as spacers and barriers, materials used such as paper or pressboard and oil, temperature etc. In this regard the second reference frequency spectrum may be determined according to the principles mentioned in for instance U. Gäfvert, L. Adeen, M. Tapper, P. Ghasemi and B. Jönsson: "Dielectric Spectroscopy in Time and Frequency Domain Applied to Diagnostics of Power Transformers", 2000 IEEE 6th International Conference on Properties and Applications of Dielectric Materials (ICPADM), Xian, China, Jun. 21-26, 2000, which is herein incorporated by reference. As an alternative it may be obtained through an actual measured frequency response that may have been obtained when the transformer was assembled in factory or first put to use. It is of course also possible that the second reference frequency spectrum may be obtained at some other time through suitable measurements.

The method starts with the signal generating unit 12 of the device 10 applying a signal of varying frequency to the primary winding 18 of the transformer 16, step 46, which may be done through sending a frequency sweeping signal into the first feeding terminal 22 of the primary winding 18 of the transformer 16. This signal is preferably a sinusoidal signal having an amplitude and which is swept in a low-frequency range. This frequency range may typically be a range between 1 mHz and 1 kHz. As an alternative it is possible to apply a signal made up of pulses, where these pulses include a frequency content that is sufficient for obtaining a frequency response in the desired frequency range. The frequency sweeping signal passes through the primary winding 18 and causes a response signal to be generated in the secondary winding 20. The response signal is received via the third terminal 26 of the secondary winding 20 by the analyzing unit 14, step 48, thereby providing a first frequency spectrum 40. The analyzing unit 14 may here store the received first frequency spectrum 40 in a memory as well as present it, perhaps together with the second reference frequency spectrum 42, in order for a user to be able to determine if there is a change in the insulating ability of the insulating material of the insulation 36.

The analyzing unit 14 does furthermore compare the received first frequency spectrum 40 with the second reference frequency spectrum 42, step 50, and detects the peak 44, which does not appear in the second reference frequency spectrum, step 52. The analyzing unit 14 thereafter analyzes the shape of the peak 44, step 54, and then determines the change in insulating ability of the insulation based on the detected peak 44, step 56.

The comparison may in more detail be performed in the following way.

The difference in height can be expressed as $$\Delta(\text{Tan} - \text{Delta}) = \frac{1}{2 \cdot (1-d)} \cdot V \quad (1)$$

where $\Delta$(Tan-Delta) is the height of the peak 44 above the second reference frequency spectrum 42 at the frequency $f_1$, d is the normalized depth and V is the normalized volume of the section with degraded insulating ability. The normalized depth is the distance in the direction from the primary to the secondary winding that is covered by the subsection with degraded insulating ability, which has been divided with the length of the insulation between the first and the second windings. The normalized volume is similarly the volume of the subsection with degraded insulating ability divided by the whole volume of the insulation.

Based on this equation (1) it is therefore possible to determine the volume V of the insulation that has degraded insulating ability.

The frequency $f_1$ may also be expressed as $$f_1 = \frac{\sigma}{2\pi \cdot \varepsilon_0 \varepsilon_r} \cdot (1-d) \quad (2)$$

where $\sigma$ is the conductivity of the volume V, $\varepsilon_0$ is the permittivity constant in vacuum, $\varepsilon_r$ the relative permittivity of the insulation, and d the normalized depth.

Based on this equation (2) it is therefore possible to determine the amount of degraded insulating ability in the form of the conductance $\sigma$.

Thus from investigating the peak 44 it is therefore possible to determine the conductivity, from which the degradation of insulating ability of the volume, the size of the volume as well as the depth d can be obtained. The amount of degraded insulating ability is thus determined based on the frequency of the peak value of the peak. The volume is determined based on the height of the peak above the second reference frequency spectrum and the depth or extension of the volume in the direction from the primary to the secondary winding is determined based also on the frequency.

The depth d may in more detail be determined based on a use of equation (2) above. Through the location of the frequency $f_1$, the product $(1-d)^*\sigma$ is determined. The imaginary and real parts of the first frequency spectrum are then separated from each other and the real part of the first frequency spectrum is compared with a real part of a second reference frequency spectrum, while an imaginary part of the response is compared with an imaginary part of the second reference frequency spectrum. Here the imaginary part corresponds to the capacitance and the imaginary part to the loss of the dielectric material. From these comparisons the depth may be obtained. A large depth will normally provide an increase in the real part of the response as compared to the real part of the reference spectrum, whereas a small depth, like a depth of 0.01 will have a negligible difference. Therefore the difference between the real parts of the response and second reference frequency spectrum may be used to determine the depth. Also the imaginary part may be used, where a larger depth provides a greater difference in the frequency spectrum and also provides these differences at lower frequencies than smaller depths. Also here there can be seen peaks, where a larger depth provides a wider peak at a lower frequency than a smaller depth.

One the depth d has been determined it is then a simple matter to go back to equations (1) and (2) and better determine the volume V and the conductivity σ.

It is possible that there are several impurities or contaminants in a volume. These may then give rise to several peaks that are superimposed on each other. Together they provide a peak that is wider than the peak for a sole contaminant. By investigating the width w of the peak of a received response it is therefore furthermore possible to discern the various impurities and degradation in insulating ability of these various impurities.

The contribution from several impurities can also be considered as caused by a generalized conductivity called "low frequency dispersion" (LFD). The expression for this is shown in equation (3) below:

$$\Delta\varepsilon_{LFD} = \frac{A_n}{\varepsilon_0} \cdot (i \cdot \omega)^{-n} \quad (3)$$

A is here a real amplitude that has been normalized with the vacuum permittivity, $\varepsilon_0$, in order for the amplitude, $A_n$, to have the meaning of a conductivity for n=1. This can be simplified into:

$$\Delta\varepsilon_{DC} = \frac{\sigma}{\varepsilon_0} \cdot (i \cdot \omega)^{-1} \quad (4)$$

The exponent has an influence on the width of the peak. A value lower than n=1 gives a broader peak. The peak position will also shift when the exponent n is changed. If it is desirable to maintain the same position of the peak, at $f_1=\omega_1/2\pi$, as for n=1 the amplitude has to be scaled according to:

$$A_n \cdot \omega_0^{-n} = A_1 \cdot \omega_0^{-1} \quad (5)$$

Through determining the volume, the depth and the amount of degraded insulating ability of the volume it is then easier to select appropriate counter-measures and above-all to better determine when such counter-measures are to be applied. This can furthermore be done without disassembling or in other ways negatively influencing the transformer. Through such a determination it is then easier to determine a service activity to be performed on the transformer, such as when it is to be replaced, repaired and/or serviced. A better knowledge of the insulating ability can therefore be of high economic importance. Through such knowledge it is furthermore easier to determine when an element is to be disconnected, which may also be of advantage from a safety point of view as well as of a power delivery point of view. The above mentioned determination may of course be combined with other types of determinations in order to determine service activities, such as investigating moisture and ageing of oil in insulations.

The device according to the present invention may be provided through a suitable programmed network analyzer (NA) or computer. The method steps being provided by the analyzing unit of the present invention may in fact be provided in the form of a computer program product comprising computer program code provided on a computer readable medium, such as on a CD ROM or other type of storage medium, and being configured to make a computer or a network analyzer perform, when said code is loaded into said computer or network analyzer, the method steps described above in relation to the analyzing unit.

The present invention may be varied in a number of ways.

It is possible to provide the present invention as a pure software tool, where the first frequency spectrum is not received but generated by the software tool. It is then possible to generate various responses for various differences in volume, depth and permittivity based on the above-mentioned electrical model. A first frequency spectrum will then be calculated based on a "normal" calculated unaffected response with a normal background permittivity, where the volume with degraded insulating ability is provided as an insert that is added with a modified permittivity. The modification here takes account of the electrical model of the insulation. This insert will then define the peak that is analyzed. In this case the response actually only corresponds to an "imaginary" frequency response which is received based on an "imaginary" signal of varying frequency applied to a winding of the transformer. Such simulated frequency spectrums may then be compared with frequency spectrums of received responses for determining degraded insulating ability.

It should also be realized that the signal of varying frequency, when being sent into a winding, may be sent to the second feeding terminal instead of the first feeding terminal and the result received from the fourth feeding terminal. It should furthermore be realized that the first bushing tap may also be used as may the second bushing tap in order to send the signal of varying frequency and receive the result of the measurement. A similar type of analysis may of course also be performed based on sending the signal of varying frequency into the secondary winding and measuring the response on the primary winding. The present invention can in fact be used for analyzing the insulation provided between any windings of a transformer. It is thus not limited to insulation between a primary and a secondary winding. The analyzing unit may furthermore emit a warning signal if one or more of the various properties of a peak and/or imaginary real parts of a response differ from corresponding pre-set values. The invention can thus be used together with alarm thresholds.

The inductively operating element analyzed that was exemplified above was a transformer. It should be realized that a transformer analyzed in this may be any type of transformer, for instance a three-phase power transformer. Such analysis may therefore be performed between any two windings of such a transformer. However, the invention is not limited to being applied to transformers. It can be applied on any inductively operating element, for instance on an inductor or a reactor. The analysis may therefore be performed between two objects of an inductively operating element that are separated by insulation, where one is a winding. The other object may thus be another winding but can also be for instance a core leg or an electrostatic shielding. From the foregoing discussion it is evident that the present invention can be varied in a multitude of ways. It shall consequently be realized that the present invention is only to be limited by the following claims.

What is claimed is:

1. A method for determining the change in insulating ability of the insulation provided between two objects of an inductively operating element, where at least one of the objects is a winding, and comprising the steps of:
    obtaining a first frequency spectrum associated with a frequency response to a signal of varying frequency, where said signal of varying frequency is a signal that can be applied to a first object of the inductively operating element and the frequency response is obtainable from a second object of the inductively operating element, comparing the obtained first frequency spectrum with a second reference frequency spectrum, detecting a peak in the obtained first frequency spectrum that does not appear in the second reference frequency spectrum, analyzing the shape of the detected peak, and determining the change in insulating ability based on the analyzed shape of the detected peak wherein the step of determining the change in insulating ability includes determining an amount of degraded insulating ability based on the frequency ($f_1$) of the peak value of the peak.

2. The method according to claim 1, wherein a volume (V) of the insulation having a degraded insulating ability is determined based on the height ($\Delta$(Tan-Delta)) of the peak above the second reference frequency spectrum.

3. The method according to claim 2, wherein the extension (d) of the volume (V) in a direction from the first to the second object is determined based on comparing at least the real part of the first frequency spectrum with a corresponding real part of the second reference frequency spectrum.

4. The method according to claim 3, wherein an increased difference between the real parts corresponds to an increased depth.

5. The method according to claim 4, wherein the extension is determined also based on comparing the imaginary part of the first frequency spectrum with a corresponding imaginary part of the second reference frequency spectrum.

6. The method according to claim 3, wherein the extension (d) is determined also based on comparing the imaginary part of the first frequency spectrum with a corresponding imaginary part of the second reference frequency spectrum.

7. The method according to claim 1, wherein various degradations of the conductive ability caused by different contaminants in the insulation is determined based on the width (w) of the peak.

8. The method according to claim 1, further comprising the step of sending the signal of varying frequency into the first object and receiving the frequency response from the second object, where the first frequency spectrum is the frequency spectrum of the received frequency response.

9. The method according to claim 1, wherein the frequency range of the first frequency spectrum is between 1 mHz and 1 kHz.

10. A device for determining the change in insulating ability of the insulation provided between two objects of an inductively operating element, where at least one of the objects is a winding, and comprising:

an analyzing unit arranged to:
obtain a first frequency spectrum associated with a frequency response to a signal of varying frequency, where said signal of varying frequency is a signal that can be applied to a first object of the inductively operating element and the frequency response is obtainable from a second object of the inductively operating element, compare the obtained first frequency spectrum with a second reference frequency spectrum, detect a peak in the obtained first frequency spectrum that does not appear in the second reference frequency spectrum, analyze the shape of the detected peak, and determine the change in insulating ability based on the analyzed shape of the detected peak, wherein the analyzing unit, when being arranged to determine the change in insulating ability is arranged to determine an amount of degraded insulating ability based on the frequency ($f_1$) of the peak value of the peak.

11. The device according to claim 10, wherein the analyzing unit, when being arranged to determine the change in insulating ability is arranged to determine a volume (V) of the insulation having a degraded insulating ability based on the height ($\Delta$(Tan-Delta)) of the peak above the second reference frequency spectrum.

12. The device according to claim 11, wherein the analyzing unit, when being arranged to determine the change in insulating ability is arranged to determine the extension (d) of the volume (V) in a direction from the first to the second object based on comparing at least the real part of the first frequency spectrum with a corresponding real part of the second reference frequency spectrum.

13. The device according to claim 12, wherein an increased difference between the real parts corresponds to an increased depth.

14. The device according to claim 12, wherein the analyzing unit is arranged to determine the extension (d) of the volume (V) also based on comparing the imaginary part of the first frequency spectrum with a corresponding imaginary part of the second reference frequency spectrum.

15. The device according to claim 10, wherein the analyzing unit when being arranged to determine the change in insulating ability is arranged to determine various degradations of the conductive ability caused by different contaminants in the insulation based on the width (w) of the peak.

16. The device according to claim 10, further comprising a signal generating unit arranged to send a signal of varying frequency into the first object of the inductively operating element and the analyzing unit is arranged to receive the frequency response from the second object, where the first frequency spectrum is the frequency spectrum of the received frequency response.

17. The device according to claim 10, wherein the frequency range of the first frequency spectrum is between 1 mHz and 1 kHz.

18. A computer program product for determining the change in insulating ability of the insulation provided between two objects of an inductively operating element, where at least one of the objects is a winding, and comprising computer program code provided on a computer readable medium and being configured to make a computer perform, when said code is loaded into said computer obtain a first frequency spectrum associated with a frequency response to a signal of varying frequency, where said signal of varying frequency is a signal that can be applied to a first object of the inductively operating element and the frequency response is obtainable from a second object of the inductively operating element, compare the obtained first frequency spectrum with a second reference frequency spectrum, detect a peak in the obtained first frequency spectrum that does not appear in the second reference frequency spectrum, analyze the shape of the detected peak, and determine the change in insulating ability based on the shape of the detected peak, wherein the determining of the change in insulating ability includes determining an amount of degraded insulating ability based on the frequency ($f_1$) of the peak value of the peak.

* * * * *